(12) United States Patent
Otremba et al.

(10) Patent No.: US 9,961,798 B2
(45) Date of Patent: May 1, 2018

(54) PACKAGE AND A METHOD OF MANUFACTURING THE SAME

(71) Applicant: Infineon Technologies Austria AG, Villach (AT)

(72) Inventors: Ralf Otremba, Kaufbeuren (DE); Klaus Schiess, Allensbach (DE); Khalil Hosseini, Weihmichl (DE)

(73) Assignee: Infineon Technologies Austria AG, Villach (AT)

( * ) Notice: Subject to any disclaimer, the term of this patent is extended or adjusted under 35 U.S.C. 154(b) by 1216 days.

(21) Appl. No.: 13/856,455

(22) Filed: Apr. 4, 2013

(65) Prior Publication Data

US 2014/0301039 A1    Oct. 9, 2014

(51) Int. Cl.
| | |
|---|---|
| *H01L 23/34* | (2006.01) |
| *H05K 7/20* | (2006.01) |
| *H01L 21/54* | (2006.01) |
| *H01L 21/56* | (2006.01) |
| *H01L 23/31* | (2006.01) |
| *H01L 23/00* | (2006.01) |
| *H01L 23/373* | (2006.01) |

(52) U.S. Cl.
CPC ......... *H05K 7/20218* (2013.01); *H01L 21/54* (2013.01); *H01L 21/56* (2013.01); *H01L 21/565* (2013.01); *H01L 23/3121* (2013.01); *H01L 24/36* (2013.01); *H01L 24/40* (2013.01); *H01L 24/41* (2013.01); *H05K 7/20* (2013.01); *H01L 23/3737* (2013.01); *H01L 2224/40245* (2013.01); *H01L 2224/40249* (2013.01); *H01L 2224/4103* (2013.01); *H01L 2924/12042* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01)

(58) Field of Classification Search
CPC ............. H01L 2924/181; H01L 23/473; H01L 2225/06589; H01L 21/4882; H01L 21/76843; H01L 21/56
USPC ................................ 257/666, 714, 787, 796
See application file for complete search history.

(56) References Cited

U.S. PATENT DOCUMENTS

| | | | |
|---|---|---|---|
| 4,631,636 A | * | 12/1986 | Andrews ................ H05K 7/02 257/714 |
| 6,771,500 B1 | | 8/2004 | Siegel et al. |
| 6,785,137 B2 | | 8/2004 | Siegel |
| 7,541,681 B2 | | 6/2009 | Otremba |
| 7,745,929 B2 | | 6/2010 | Otremba |

(Continued)

FOREIGN PATENT DOCUMENTS

| | | |
|---|---|---|
| CN | 101026138 A | 8/2007 |
| CN | 102522376 A | 6/2012 |

(Continued)

*Primary Examiner* — S. V. Clark
(74) *Attorney, Agent, or Firm* — Viering, Jentschura & Partner mbB

(57) ABSTRACT

In various embodiments, a package may be provided. The package may include a chip carrier. The package may further include a chip arranged over the chip carrier. The package may also include encapsulation material encapsulating the chip and partially the chip carrier. A coolant receiving recess may be provided over the chip in the encapsulation material, wherein the coolant receiving recess is configured to receive coolant.

10 Claims, 14 Drawing Sheets

(56) References Cited

U.S. PATENT DOCUMENTS

| | | | |
|---|---|---|---|
| 7,757,392 B2 | 7/2010 | Otremba | |
| 7,759,170 B2 * | 7/2010 | Pu | H01L 23/3157 257/707 |
| 7,786,558 B2 | 8/2010 | Otremba | |
| 8,044,523 B2 | 10/2011 | Otremba | |
| 8,283,758 B2 | 10/2012 | Jiang | |
| 8,941,248 B2 * | 1/2015 | Lin | H01L 21/563 257/778 |
| 2005/0116335 A1 * | 6/2005 | Karim | H01L 23/4334 257/718 |
| 2007/0138656 A1 | 6/2007 | Khaw et al. | |
| 2007/0290310 A1 | 12/2007 | Kusano et al. | |
| 2008/0054449 A1 | 3/2008 | Hirler et al. | |
| 2010/0013367 A1 * | 1/2010 | Yang | F21V 29/004 313/46 |
| 2010/0133670 A1 | 6/2010 | Liu et al. | |
| 2011/0024892 A1 | 2/2011 | Lin et al. | |
| 2012/0153446 A1 | 6/2012 | Jiang | |
| 2013/0093075 A1 * | 4/2013 | Liu | H01L 23/36 257/712 |

FOREIGN PATENT DOCUMENTS

| | | |
|---|---|---|
| DE | 102007019686 A1 | 11/2007 |
| DE | 102004030042 B4 | 4/2009 |
| DE | 102005057401 B4 | 10/2009 |
| EP | 0709884 A2 | 5/1996 |
| JP | 2004335493 A | 11/2004 |
| JP | 2005057130 A | 3/2005 |

* cited by examiner

Providing a chip carrier
402

Arranging a chip over the chip carrier
404

Encapsulating the chip and partially the chip carrier with an encapsulating material, wherein a coolant receiving recess is provided in the encapsulation material
406

PACKAGE AND A METHOD OF MANUFACTURING THE SAME

TECHNICAL FIELD

Various embodiments relate generally to packages and methods of manufacturing the same.

BACKGROUND

FIG. 1 is a schematic 100 showing a semiconductor package. An example of a semiconductor package is a Power Quad-Flat-Nonleaded (QFN) package or a power Dual-Flat-Nonleaded (DFN) package. A semiconductor package may include a chip 102 mounted on a substrate or carrier such as a leadframe 104. The chip 102 and the carrier 104 may be at least be partially covered by an encapsulant material 106. The thermal resistance of a junction (J) at an ambient (A) temperature, $R_{thJA}$, of semiconductor packages depend on the cooling performance of the packages. For instance, an application level Power DFN package such as PG-TD-SON-8 (Plastic Green Thin Dual Small Outline Non-leaded Package), also known as SuperSO8 or S3O8, may strongly depend on cooling performance.

FR (flame retardant)-4 (or FR4) is a grade designation assigned to glass-reinforced epoxy laminate sheets, tubes, rods and printed circuit boards. For many semiconductor packages using FR4 substrates, the cooling performance is not ideal. The non-ideal cooling performance limits the thermal resistance of the semiconductor packages.

SUMMARY

In various embodiments, a package may be provided. The package may include a chip carrier. The package may further include a chip arranged over the chip carrier. The package may also include encapsulation material encapsulating the chip and partially the chip carrier. A coolant receiving recess may be provided over the chip in the encapsulation material, wherein the coolant receiving recess is configured to receive coolant.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2A a cross-sectional side view of a package according to various embodiments while

FIG. 3A shows a cross-sectional side view of a package according to various embodiments while

FIG. 4 shows a method of manufacturing a package according to various embodiments;

FIG. 5, which includes FIGS. 5A to H, shows a method of manufacturing a package; wherein FIG. 5A shows a cross-sectional side view of a chip arranged over a chip carrier according to various embodiments; wherein FIG. 5B shows a top planar view of the chip arranged over the chip carrier according to various embodiments; wherein FIG. 5C shows a cross-sectional side view of an arrangement including an electrically conductive coupling structure coupled to the chip and the chip carrier as shown in FIG. 5A according to various embodiments; wherein FIG. 5D shows a top planar view of the arrangement including an electrically conductive coupling structure coupled to the chip and the chip carrier as shown in FIG. 5B according to various embodiments; wherein FIG. 5E shows a cross-sectional side view of a package after encapsulating the arrangement shown in FIG. 5C according to various embodiments; wherein FIG. 5F shows a top planar view of a package after encapsulating the arrangement as shown in FIG. 5D according to various embodiments; wherein FIG. 5G shows a cross-sectional side view of the package shown in FIG. 5E after receiving coolant according to various embodiments; and wherein FIG. 5H shows a top planar view of the package shown in FIG. 5F after receiving coolant according to various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a component or a chip "over" a subsequent chip or component, may be used herein to mean that the component or the chip may be arranged "directly on", e.g. in direct contact with, the subsequent chip or component. The word "over" used with regards to a component or a chip arranged "over" a subsequent chip or component, may be used herein to mean that the component or the chip may be formed "indirectly on" the subsequent chip or component with one or more additional layers being arranged between the subsequent chip or component and the component or the chip.

It should be understood that the terms "top", "bottom", "front", "back", "side", "left", "right", "base", "down", "sideways", "downwards" etc., when used in the following description are used for convenience and to aid understanding of relative positions or directions, and not intended to limit the orientation of the package arrangement or the packages making up the package arrangement.

Various aspects of this disclosure provide a package and a method of manufacturing the same that is able to address at least partially some of the abovementioned challenges.

Figure 1:
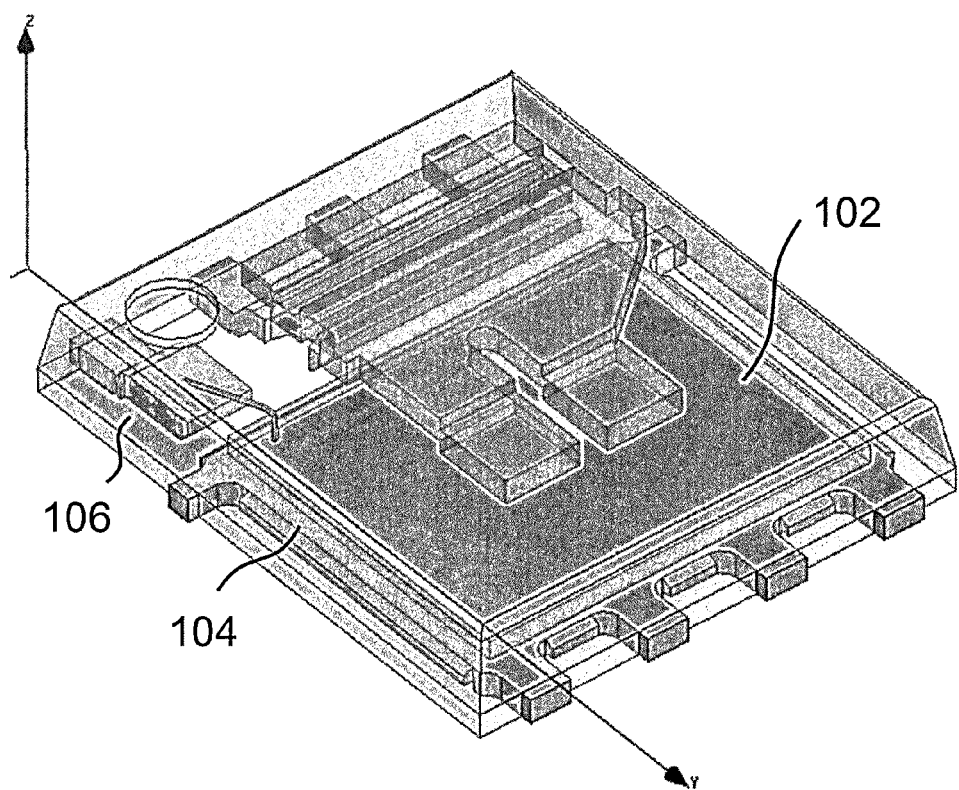
FIG. 1 shows a semiconductor package.
Figure 2A:
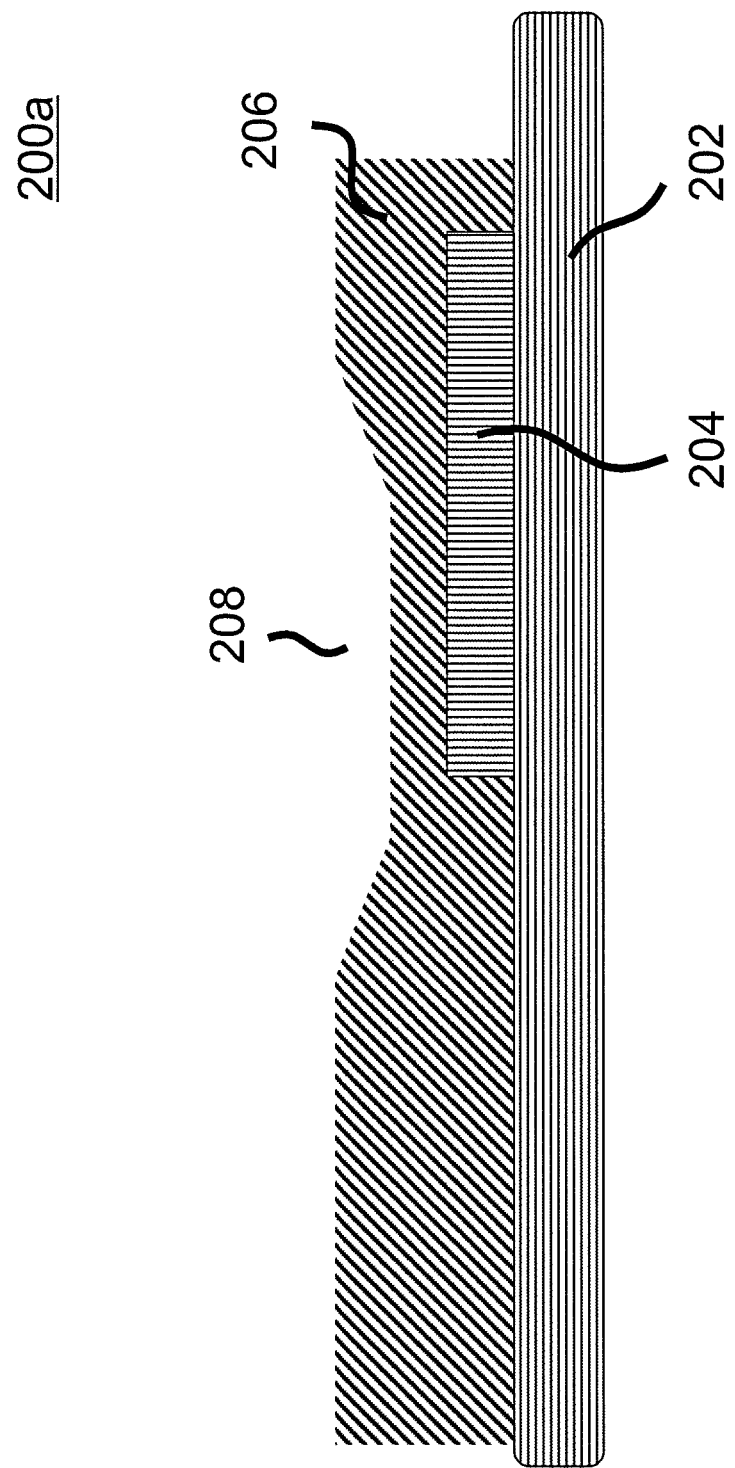
Figure 2B:
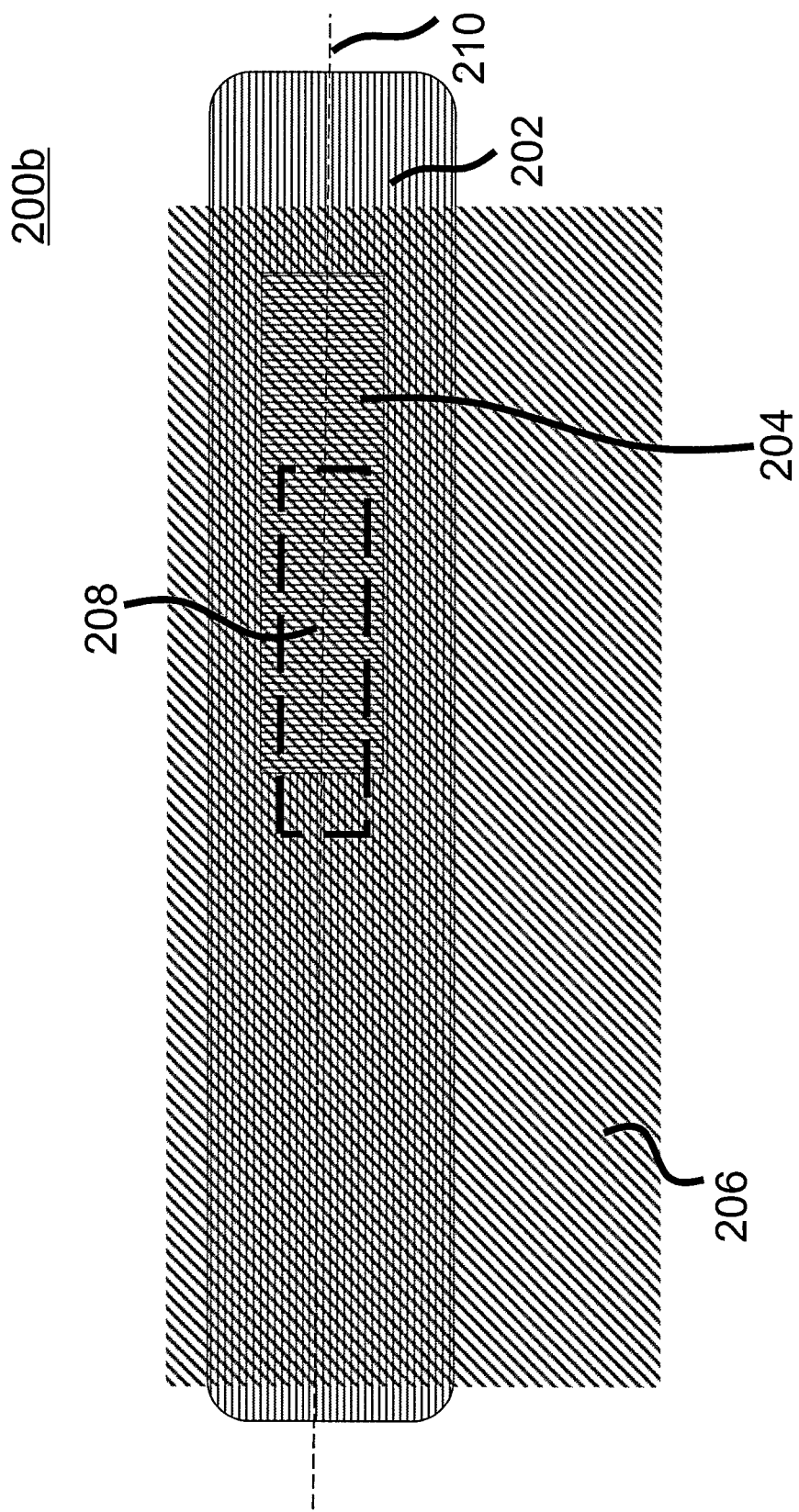
FIG. 2B shows a top planar view of a package according to various embodiments.

FIG. 2A is a schematic 200a shows a cross-sectional side view of a package according to various embodiments. FIG. 2B is a schematic 200b shows a top planar view of a package according to various embodiments. FIG. 2A may correspond to the cross sectional view of the package shown in FIG. 2B across the line 210 indicated in FIG. 2B. The package may include a chip carrier 202. The package my further include a chip 204 arranged over the chip carrier 202. The package may also include encapsulation material 206 encapsulating the chip 204 and partially the chip carrier 202. A coolant receiving recess may be provided over the chip in the encapsulation material, wherein the coolant receiving recess is configured to receive coolant.

In other words, the package may include a stacked arrangement including a chip 204 over a chip carrier 202. The chip 204 and the chip carrier 202 may at least be partially covered by encapsulation material 206. The encapsulation material 206 may also include a coolant receiving recess 208. A coolant receiving recess may be provided over the chip in the encapsulation material, wherein the coolant receiving recess may be configured to receive coolant.

In various embodiment, the package may be referred to a package with Top Side Cavity. Various embodiments may relate to packages for high power applications. Packages for high power applications may be referred to as power packages.

The coolant receiving recess 208 may be configured to receive a coolant. The package may include the coolant received in the coolant receiving recess 208. The package with coolant received in the coolant receiving recess may be referred to as a package with Top Side Filling. In various embodiments, the coolant may improve the cooling performance of the package.

In various embodiments, a coolant may be any material that helps to improve the heat dissipation of the package. A coolant may have a thermal conductivity greater than air.

In various embodiments, the coolant may include thermal greece. Thermal greece may also be known as thermal grease, thermal paste, thermal gel, thermal compound, heat paste, heat sink paste or heat sink compound. The thermal greece may be a ceramic-based thermal greece, which may include a ceramic powder suspended in a liquid or gelatinous material. The ceramic powder may include aluminum nitride (AlN), boron nitride (BN), aluminum oxide ($Al_2O_3$), silicon oxide ($SiO_2$), silicon nitride (SiN), beryllium oxide (BeO) or zinc oxide (ZnO). A ceramic-based thermal greece may be electrically insulating. The thermal greece may be a metal-based greece, which may include solid metal particles (such as silver or aluminum) or metal oxide particles or metal alloy particles suspended in a liquid or gelatinous material. A metal-based greece may be electrically conductive. The thermal greece may be a carbon-based greece, which includes diamond powder, carbon fibers, carbon tubes (such as carbon nanotubes) or carbon particles suspended in a liquid or gelatinous material. The thermal greece may instead, be a silicon-based greece, which include silicon particles, silicon powder, silicon nanoparticles. The thermal greece may also include glass suspended in a liquid or gelatinous material. The liquid or gelatinous material may be a silicone compound. The liquid or gelatinous material may also be a mineral oil.

The coolant may also include solder such as SnAg, SnCu, InAg, InCu, Zn or PbSn. Alternatively, the coolant may include metals or metal ions such as Cu or Ni.

The package may be coupled to a cooling mechanism such that the coolant which is heated up by the package may be cooled. The cooled coolant may then be returned to the coolant receiving recess 208. For instance, the coolant may be carried by a first microfluidic channel to a cooling structure such as a heatsink or a fan. The heated coolant may be cooled by the cooling structure. The cooled coolant is then carried to the coolant receiving recess 208 by a second microfluidic channel. Fluid delivery structures such as microfluidic channels may be on the encapsulation material 206. The fluid delivery structures may connect the coolant receiving recess 508 to an external input means or to an external output means. The fluid delivery structures may also instead form an enclosed loop.

The coolant may instead help to transmit or dissipate heat to the environment. The coolant may transmit heat to a cooling structure such as a heat sink.

The encapsulation material 206 may be a mold compound. The encapsulation material 206 encapsulating the chip 204 may include the encapsulation material 206 covering at least a portion of the chip 204. Correspondingly, the encapsulation material 206 encapsulating the chip carrier 202 may include the encapsulation material 206 covering at least a portion of the chip carrier 202.

The coolant receiving recess 208 may include a volume in a range from about 0.25 $mm^3$ to about 250 $mm^3$, e.g. from about 1 $mm^3$ to about 10 $mm^3$. The coolant receiving recess 208 may be about 10% to about 50% of a volume of the package, e.g. about 25% of the volume of the package.

The chip 204 may be or include a transistor. For example, the chip 204 may be or include a metal oxide field effect transistor (MOSFET) such as a power MOSFET. The chip 204 may alternatively or additionally be or include a bipolar transistor such as an insulated gate bipolar transistor (IGBT). The chip 204 may include an integrated circuit such as a logic integrated circuit, a memory integrated circuit or a power integrated circuit. The integrated circuit may be an application specific integrated circuit (ASIC) or a field programmable gate array (FPGA). As an alternative, the integrated circuit may be any other programmable logic circuit such as e.g. a programmable processor, e.g. a programmable microprocessor or programmable nanoprocessor. The chip 204 may include additional or alternatively include a capacitor, an inductor, a resistor or any other electrical components.

The package may also include one or more subsequent chips. The one or more subsequent chips may be arranged over the chip carrier 202. The one or more subsequent chips may be arranged laterally to the chip 204. Alternatively, the one or more subsequent chips and the chip 204 may form a stacked arrangement. The one or more subsequent chips may be electrically coupled to the chip 204 and/or the chip carrier 204. The one or more subsequent chips may cooperate with the chip 204 to perform a function. The chip 204 and the subsequent chips may be different modules for performing the function.

In various embodiments, the package may include an electrically conductive coupling structure. The coupling structure may be configured to electrically couple the chip 204 with the chip carrier 202. The coupling structure and the chip carrier 202 may be arranged on opposite sides of the chip 202. The coolant receiving recess 208 may expose the conductive coupling structure configured to electrically couple the chip 204 with the chip carrier 202. By way of non-limiting examples, the coupling structure may be a clip or a ribbon bond or a contact bridge.

The chip carrier 202 may include a leadframe. The leadframe may include a die pad and at least one lead. The electrically conductive coupling structure may be configured to electrically couple the chip 204 with the at least one lead. The chip 204 may also be electrically coupled to the die pad. Alternatively, the chip 204 may be electrically insulated to the die pad. A portion of the chip carrier 202, for example a portion of the at least one lead, may protrude out of the encapsulation material 206. The portion of the chip carrier 202 that protrudes out of the encapsulation material may be configured to be electrically coupled to an external device or component.

In various embodiments, the coolant receiving recess 208 may expose a chip pad. The chip pad may be on the chip 204. The coolant may be in direct contact with the chip pad. The coolant may be thermally conductive but electrically insulating. By directly contacting the coolant with the chip pad, a faster cooling rate of the chip 204 may be achieved.

In various other embodiments, the coolant receiving recess 208 may expose a portion of the chip 204 without exposing the chip pad. In other words, the coolant receiving recess 208 may be isolated from the chip pad. The coolant receiving recess 208 may expose a portion of the carrier 202 but not any contacts or surface metallization such as electrical traces. In other words, the contact(s) and/or the surface metallization such as electrical traces remain covered by the encapsulation material. In other words, the coolant receiving recess may be isolated from any contacts or surface metallization. As the coolant may not be in electrical contact with any contacts or chip pads or metallization, the coolant may be electrically conductive or may include material that is electrically conductive.

In various embodiments, the coolant receiving recess 208 may expose a portion of the chip carrier 202. The coolant may be in direct contact with the chip carrier 202. For instance, the coolant receiving recess 208 may expose a portion of the at least one lead.

Figure 3A:
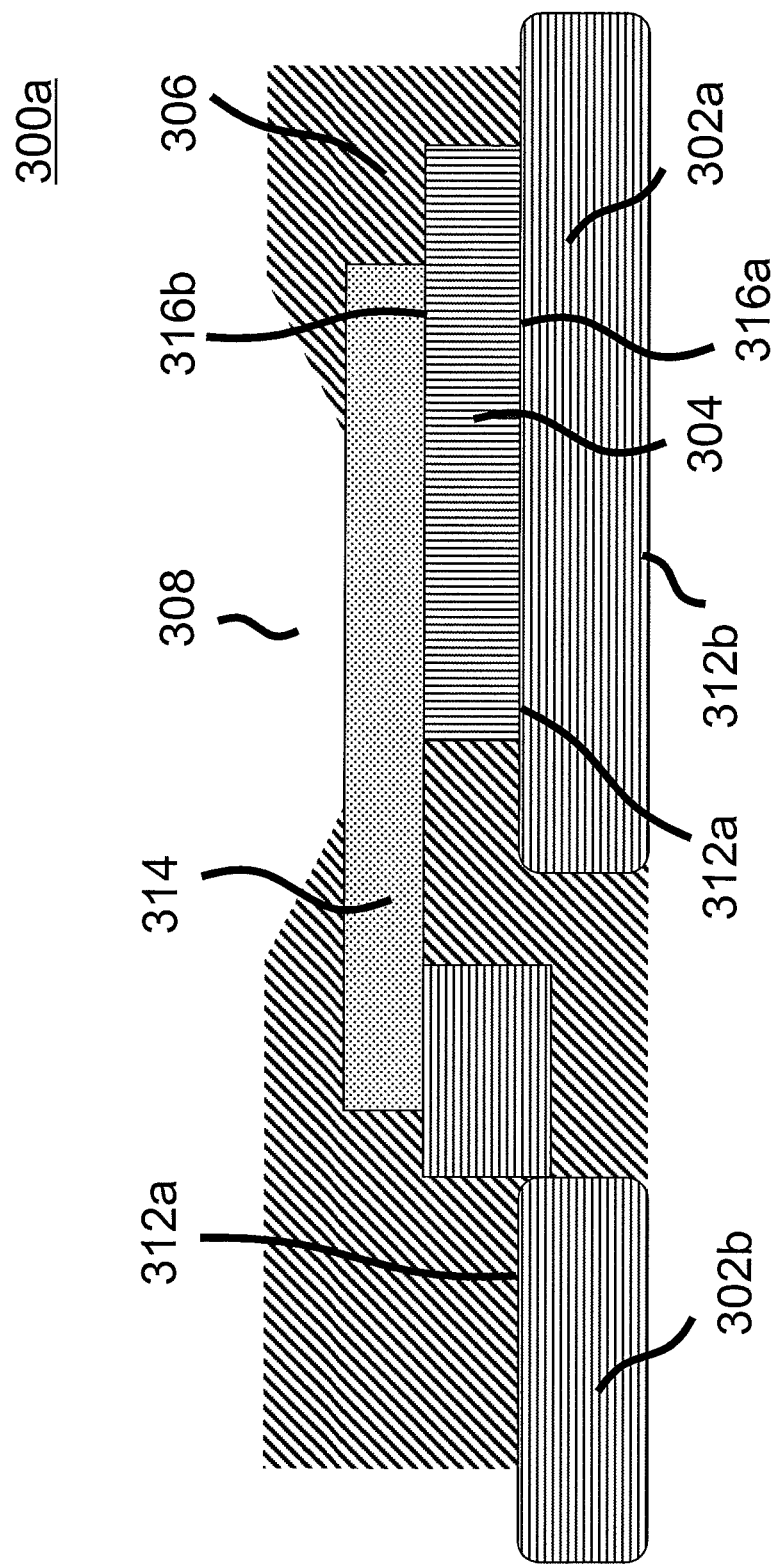
Figure 3B:
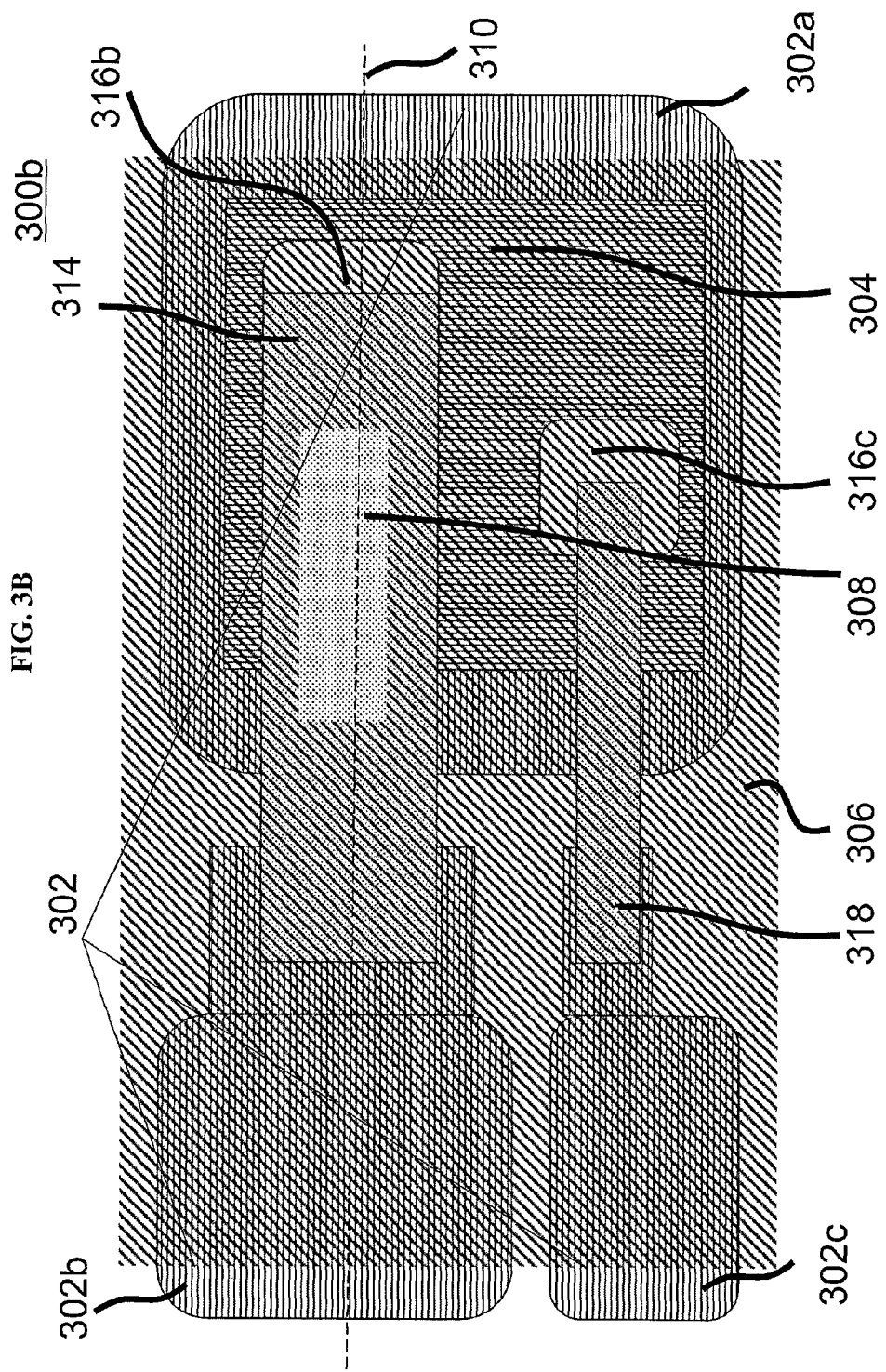
FIG. 3B shows a top planar view of a package according to various embodiments.

FIG. 3A is a schematic 300a shows a cross-sectional side view of a package according to various embodiments. FIG. 3B is a schematic 300b shows a top planar view of a package according to various embodiments. FIG. 3A may correspond to the cross sectional view of the package shown in FIG. 3B across the line 310 indicated in FIG. 3B. The package may include a chip carrier 302. The package my further include a chip 304 arranged over the chip carrier 302.

The chip carrier 302 may be a lead frame. The chip carrier 302 may include a die pad 302a. The chip carrier may also include at least a first lead 302b and a second lead 302c. The chip 304 may be arranged over the die pad 302a.

The package may also include encapsulation material 306 encapsulating the chip 304 and the chip carrier 302. In other words, the encapsulation material 306 may cover at least a portion of the chip 304 and at least a portion of the chip carrier 302. For instance, the chip carrier 302 may have a first main surface 312a and a second main surface 312b opposite the first main surface 312a. The chip may be arranged over the first main surface 312a of the chip carrier 302, for instance the first main surface 312a of the die pad 302a. The first main surface 312a of the chip carrier 302 may be covered by the encapsulation material 306 while the second main surface 312b of the chip carrier 302 may be exposed. The encapsulation material 306 may include a mold compound.

A coolant receiving recess 308 may be provided in the encapsulation material 306. The coolant receiving recess 308 may be configured to receive coolant. The package may include coolant received in the cooling receiving recess 308.

In various embodiments, the coolant may include thermal greece. Thermal greece may also be known as thermal grease, thermal paste, thermal gel, thermal compound, heat paste, heat sink paste or heat sink compound. The thermal greece may be a ceramic-based thermal greece, which may include a ceramic powder suspended in a liquid or gelatinous material. The ceramic powder may include aluminum nitride (AlN), boron nitride (BN), aluminum oxide ($Al_2O_3$), silicon oxide ($SiO_2$), silicon nitride (SiN), beryllium oxide (BeO) or zinc oxide (ZnO). The thermal greece may be a metal-based greece, which may include solid metal particles (such as silver or aluminum) or metal oxide particles or metal alloy particles suspended in a liquid or gelatinous material. The thermal greece may be a carbon-based greece, which includes diamond powder, carbon fibers, carbon tubes (such as carbon nanotubes) or carbon particles suspended in a liquid or gelatinous material. The thermal greece may also include glass suspended in a liquid or gelatinous material.

The liquid or gelatinous material may be a silicone compound. The liquid or gelatinous material may also be a mineral oil.

The coolant may also include solder such as SnAg, SnCu, InAg, InCu, Zn or PbSn. In addition, the coolant may include metals such as Cu or Ni.

The coolant receiving recess 308 may include a volume in a range from about 0.25 mm$^3$ to about 250 mm$^3$, e.g. from about 1 mm$^3$ to about 10 mm$^3$. The coolant receiving recess 308 may be about 10% to about 50% of a volume of the package, e.g. about 25% of the volume of the package.

The package may further include an electrically conductive coupling structure 314. The electrically conductive coupling structure 314 may electrically couple the chip 304 with the chip carrier 302. As shown in FIGS. 3A and 3B, the electrically conductive coupling structure 314 may electrically couple the chip 304 with the first lead 302b. In addition, the chip 304 may also electrically couple with the die pad 302a. The electrically conductive coupling structure 314 may be a structure such as a clip or a ribbon bond or a conductive bridge.

The chip 304 may include a plurality of chip pads 316a, 316b, 316c. The chip 304 may be electrically coupled to the die pad 302a. The chip 304 may be electrically coupled to the die pad 302a via a first chip pad 316a. The chip 304 may be soldered to the die pad 302a, i.e. the chip 304 may be electrically coupled to the die pad 302a via a solder structure. The electrically conductive coupling structure 314 may electrically couple the chip 304 with the chip carrier 302 via a second chip pad 316b. The electrically coupling structure 314 may be electrically coupled to the second chip pad 316b via a solder structure or glued with conductive filling material. In other words, the electrically conductive coupling structure 314 may be soldered to the second chip pad 316b.

The package may also include a further electrically conductive coupling structure 318. The further electrically conductive coupling structure 318 may also electrically couple the chip 304 with the chip carrier 302. The further electrically conductive coupling structure 318 may electrically couple the chip 304 with the second lead 302c. The further electrically conductive coupling structure 318 may electrically couple the chip 304 with the chip carrier 302 via a third chip pad 316c. The further electrically conductive coupling structure 318 may be soldered to the third chip pad 316c, i.e. the further electrically conductive coupling structure 318 may be electrically coupled to the third chip pad 316c via a solder structure. The further electrically conductive coupling structure 318 may be a structure such as a clip or a ribbon bond or a conductive bridge. The further electrical interconnection structure 318 may be connected to the second lead 302c and/or to the third chip pad 316c by wire bonding, for example.

The chip 304 may be or include a metal oxide field effect transistor (MOSFET) such as a power MOSFET. In various embodiments, the first chip pad 316a may be or may include a drain electrode. The second chip pad 316b may be or may include a source electrode. The third chip pad 316c may be or may include a gate electrode. However, the first chip pad 316a may instead be or may include the source electrode or gate electrode, the second chip pad 316b may instead be or may include the gate electrode or drain electrode, and the chip pad 316c may instead be or may include the drain electrode or source electrode.

The chip 304 may instead be or include a bipolar transistor such as an insulated gate bipolar transistor (IGBT). In the case that the chip 304 may be or include a bipolar transistor, the first chip pad 316a may be or may include a collector electrode, the second chip pad 316a may be or may include a emitter electrode and the third chip pad 316a may be or may include a base electrode. However, the first chip pad 316a may instead be or may include the emitter electrode or base electrode, the second chip pad 316b may instead be or may include the base electrode or collector electrode, and the chip pad 316c may instead be or may include collector electrode or emitter electrode.

In various embodiments, the coolant receiving recess 308 may expose the electrically conductive coupling structure 314. The coolant receiving recess 308 may alternatively or additionally expose the further electrically conductive coupling structure. The coolant receiving recess 308 may instead or also expose at least a portion of the chip 304 (such as one or more chip pads 316a, 316b, 316c) or a portion of the chip carrier 302.

In case in which the coolant receiving recess 308 exposes a structure such as a contact, a chip pad or metallization configured to carry electric current during operation, the coolant may be electrically insulating. In cases in which the coolant receiving recess 308 is not exposed to any structure configured to carry electric current during operation, the coolant may be electrically conductive. In other words, in case in which the coolant receiving recess 308 is isolated from any structure configured to carry electric current during operation, the coolant may be electrically conductive.

FIG. 4 is a schematic 400 showing a method of manufacturing a package according to various embodiments. The method may include, in 402, providing a chip carrier. The method may also include, in 404, arranging a chip over the chip carrier. The method may further include, in 406, encapsulating the chip and partially the chip carrier with an encapsulating material. A coolant receiving recess may be provided over the chip in the encapsulation material, wherein the coolant receiving recess may be configured to receive coolant.

In various embodiments, the coolant receiving recess may be configured to receive coolant.

In various embodiments, the method may further receiving coolant in the coolant receiving recess. The coolant may be transported to the coolant receiving recess via a microfluidic channel or a tube or any other suitable means.

In various embodiments, the coolant may include thermal greece.

The coolant receiving recess may include a volume in a range from about 0.25 mm³ to about 250 mm³, e.g. from about 1 mm³ to about 10 mm³. The coolant receiving recess may be about 10% to about 50% of a volume of the package, e.g. about 25% of the volume of the package.

In various embodiments, the coolant receiving recess may expose an electrically conductive coupling structure configured to electrically couple the chip with the chip carrier. The method may include providing the electrically conductive coupling structure to couple the chip with the chip carrier. The method may include coupling the electrically conductive coupling structure to the chip carrier. The electrically conductive coupling structure may be coupled to the chip carrier by soldering or any other suitable methods. The method may also include coupling the electrically conductive coupling structure to the chip. The electrically conductive coupling structure may be coupled to the chip by soldering or any other suitable methods.

The chip carrier may include a leadframe including a die pad and at least one lead. The electrically conductive coupling structure may be configured to electrically couple the chip with the at least one lead.

In various embodiments, the coolant receiving recess may expose a chip pad. The coolant receiving recess may alternative or additionally, expose a portion of the chip.

The chip carrier may include a leadframe including a die pad and at least one lead. The coolant receiving recess may expose a portion of the at least one lead The method may further include locally removing a portion of the encapsulation material to provide the coolant receiving recess in the encapsulation material. The portion of the encapsulation material may be removed after the encapsulation process. Removing the a portion of the encapsulation material may include etching or drilling. Drilling may include laser drilling.

In various embodiments, the coolant receiving recess may be provided in the encapsulation material during encapsulating the chip and partially the chip carrier with the encapsulation material. In other words, in various embodiments, the coolant receiving recess may be formed during encapsulating the chip and chip carrier with the encapsulation material. In various embodiments, encapsulating the chip and chip carrier as well as providing the coolant receiving recess may be carried out in one step.

Encapsulating the chip and partially the chip carrier may include using a mold. Encapsulating the chip and partially the chip carrier may include bringing a mold to or over the chip and chip carrier such that at least one mold cavity is formed between the mold and chip as chip carrier. The process may also include heating the encapsulation material such as a mold compound until it is liquefied. The process may further include flowing the liquefied encapsulation material such as the mold compound into the at least one mold cavity. In addition, the process may include allowing the liquefied encapsulation material (e.g. mold compound) to solidify under elevated temperature and pressure such that the chip and chip carrier is encapsulated by the encapsulation material (e.g. mold compound). The mold may be configured that such that the coolant receiving recess may be formed when the liquefied encapsulation material solidifies in the at least one mold cavity. The mold may be configured that such that a coolant receiving recess exposing the chip pad or a portion of the chip carrier or a portion of the at least one lead of a leadframe may be formed when the liquefied encapsulation material solidifies in the at least one mold cavity.

Encapsulating the chip and partially the chip carrier with the encapsulation material may include encapsulating the chip and chip carrier with the encapsulation material with a film assisted molding process. The encapsulation material may include a mold compound. The process may include bringing a mold to or over the chip and chip carrier such that at least one mold cavity is formed between the mold and chip as chip carrier. Additionally, a further mold may be provided below the chip and chip carrier such that at least one mold cavity can be formed between the two molds and the chip and chip carrier. The process may also include having a film between the mold and the chip as well as chip carrier. The film may cover the inner surface of the mold within the mold cavity. A further film may also be provided between the further mold and the chip as well as chip carrier. The further film may cover the inner surface of the further mold within the mold cavity. The process may also include heating the encapsulation material such as a mold compound until it is liquefied. The process may further include flowing the liquefied encapsulation material such as the mold compound into the at least one mold cavity. In addition, the process may include allowing the liquefied encapsulation material (e.g. mold compound) to solidify under elevated temperature and pressure such that the chip and chip carrier is encapsulated by the encapsulation material (e.g. mold compound).

The coolant receiving recess may be provided in the encapsulation material by depositing less encapsulation material in a first region compared to a second region. Depositing may include by sputtering, evaporation, chemical vapour deposition or any other suitable means of deposition. The first region may be configured to form the coolant receiving recess. In other words, by depositing a first region with less encapsulation material and by depositing a second region with more encapsulation material, a cavity may be formed. The cavity may be the coolant receiving recess.

In various embodiments, the first region may be covered by a masking material. In various embodiments, the second region may be exposed. The method may include depositing a layer of masking material to cover the first region and the second region, followed by a photolithographic process to remove the masking material covering the second region. The masking material may be a photoresist. The method may further include depositing the encapsulation material. Encapsulation material may be deposited to cover the second region and the masking material covering the first region. The method may include a lift off process to remove the masking material and the encapsulation material covering the masking material. In various embodiments, the encapsulation material may cover only the second region. The first region may be configured to form the coolant receiving recess. Various embodiments may include a coolant receiving recess exposing a chip pad or a portion of the chip carrier or a portion of at least one lead of a leadframe. The method may including covering the chip pad or the portion of the chip carrier or the portion of at least one lead of a leadframe with masking material. The chip pad or the portion of the chip carrier or the portion of at least one lead of a leadframe may be in the first region where less or no encapsulation material is deposited.

In various embodiments, the coolant receiving recess may be provided in the encapsulation material before encapsulating the chip and chip carrier with the encapsulation material. The shape of the coolant receiving recess may already be in the encapsulation or molding preform. After encapsulating the chip and partially the chip carrier with the encapsulation material (such as the encapsulation or molding preform), the coolant receiving recess may remain on the encapsulation material.

Figure 5A:
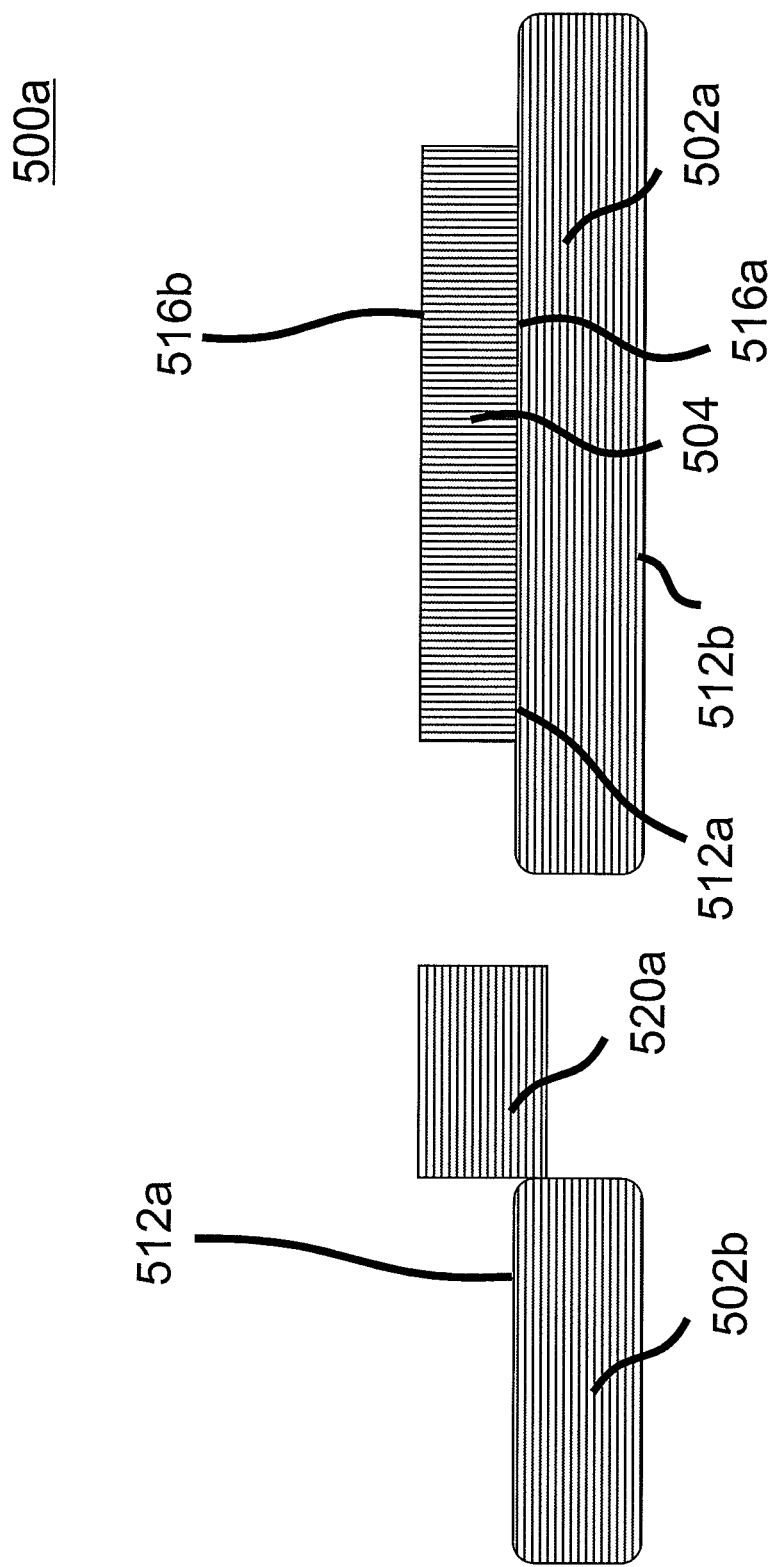
Figure 5B:
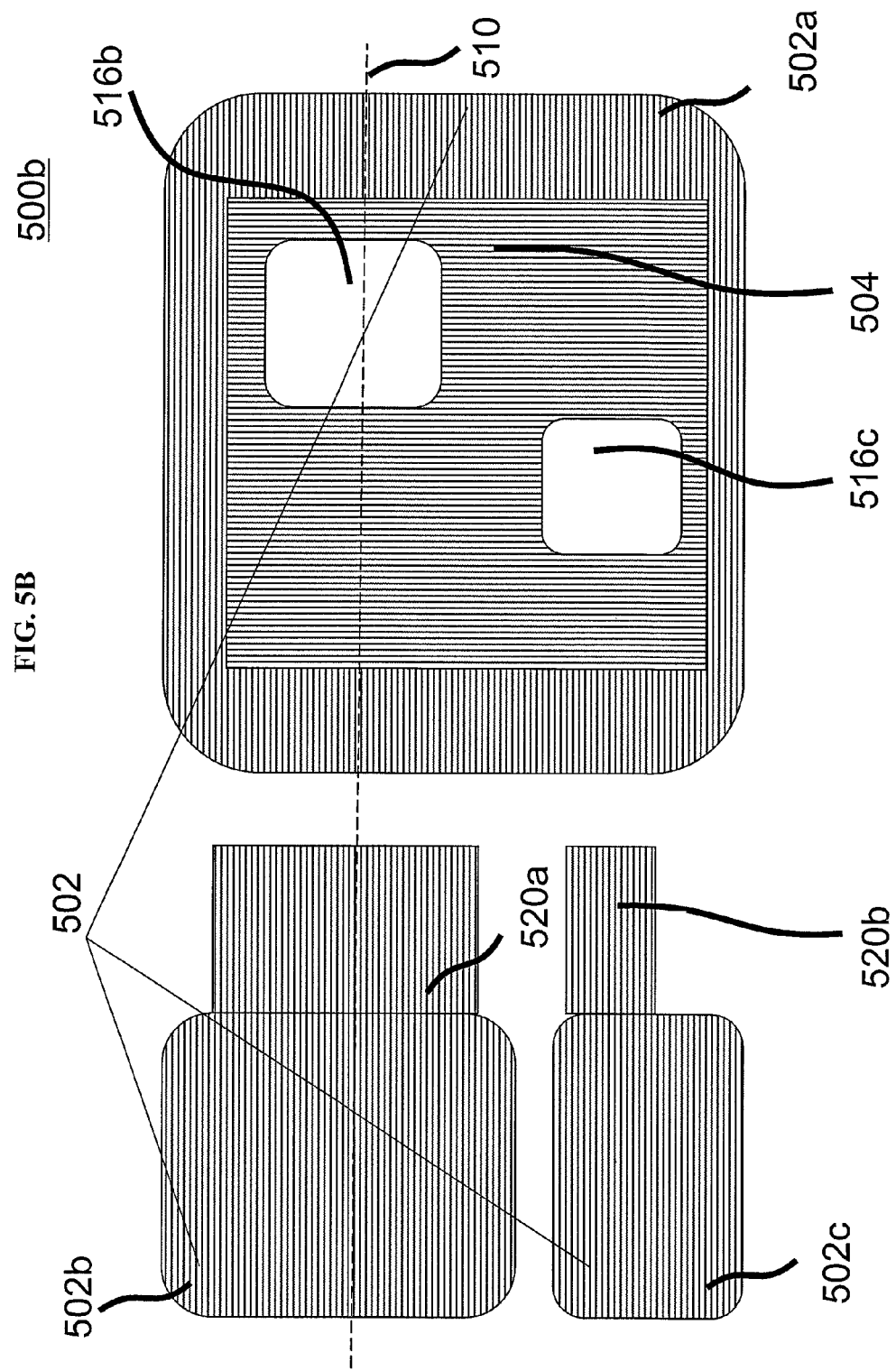

FIG. 5A is a schematic 500a showing a cross-sectional side view of a chip 504 arranged over a chip carrier 502 according to various embodiments. FIG. 5B is a schematic 500b showing a top planar view of the chip 504 arranged over the chip carrier 502 according to various embodiments. FIG. 5A may correspond to the cross sectional view of the chip 504 and chip carrier 502 shown in FIG. 5B across the line 510 indicated in FIG. 5B.

A method of manufacturing a package may be provided. The method may include providing a chip carrier 502 and arranging a chip 504 over the chip carrier 502. The chip carrier 302 may be a lead frame. The chip carrier 502 may have a first main surface 512a and a second main surface 512b opposite the first main surface 512a. The chip carrier may include a die pad 502a. The chip carrier may also include at least a first lead 502b and a second lead 502c. The chip 504 may be arranged over the die pad 502a.

The chip 504 may include a plurality of chip pads 516a, 516b, 516c. The chip 504 may be electrically coupled to the die pad 502a. The chip 504 may be electrically coupled to the die pad 502a via a first chip pad 516a. The method may include soldering the chip 502 to the die pad 502a such that the 504 may be electrically coupled to the die pad 502a via a first chip pad 516a.

The chip carrier 502 may further include protrusions 520a, 520b. The protrusions may extend from a plane including the die pad 502a, the first lead 502b and the second lead 502c. The protrusion 520a may extend from the first lead 502b. The protrusion 520b may extend from the second lead 520c. The protrusions 520a, 520b may be a part of the chip carrier 502 (e.g. leadframe). Alternatively, the protrusions 520a, 520b may be subsequently attached to the chip carrier 502. The protrusions 520a, 520b may be electrically conductive.

The chip 504 may be or include a metal oxide field effect transistor (MOSFET) such as a power MOSFET. In various embodiments, the first chip pad 516a may be or may include a drain electrode. The second chip pad 516b may be or may include a source electrode. The third chip pad 516c may be or may include a gate electrode.

Figure 5C:
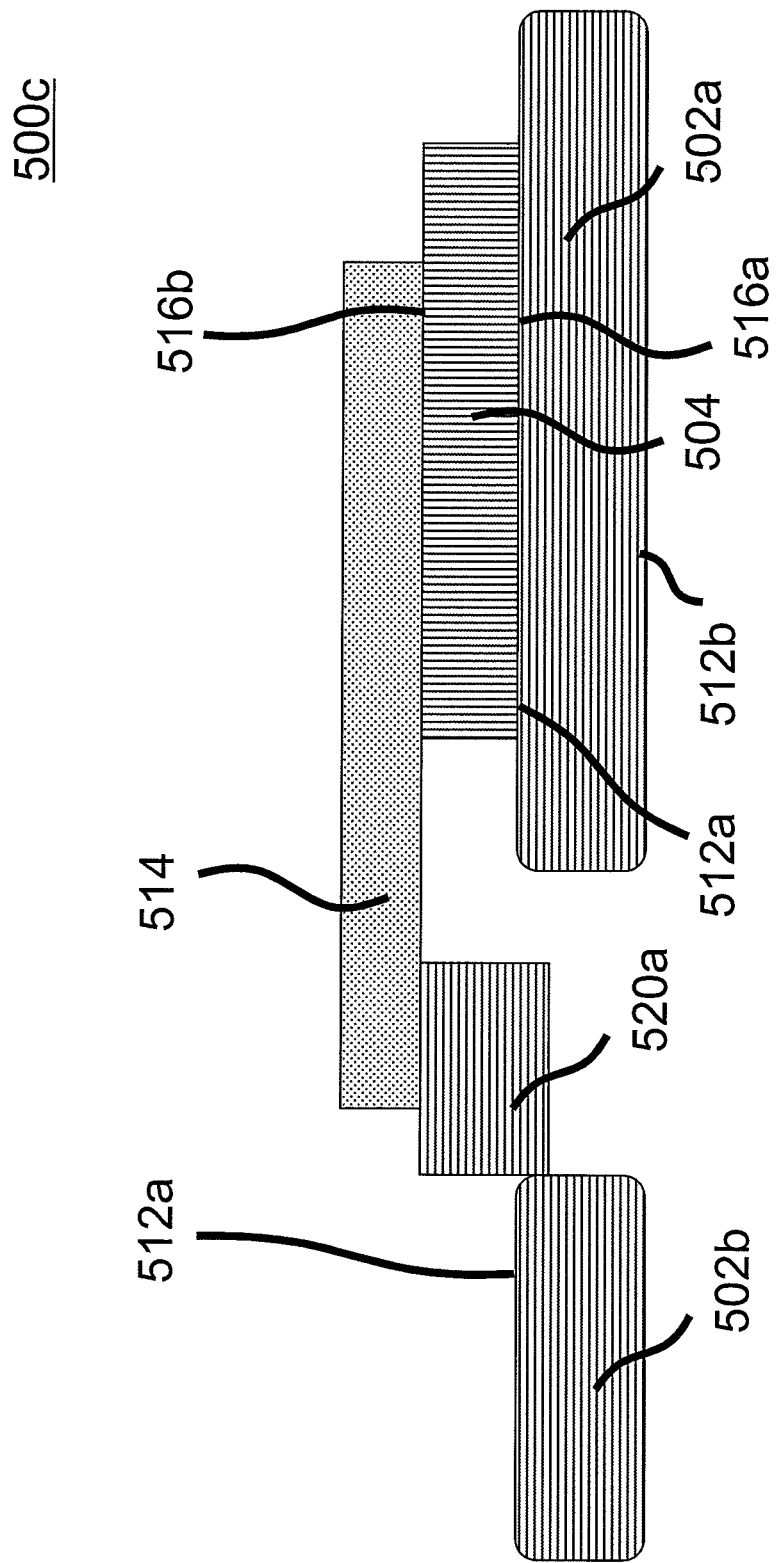
Figure 5D:
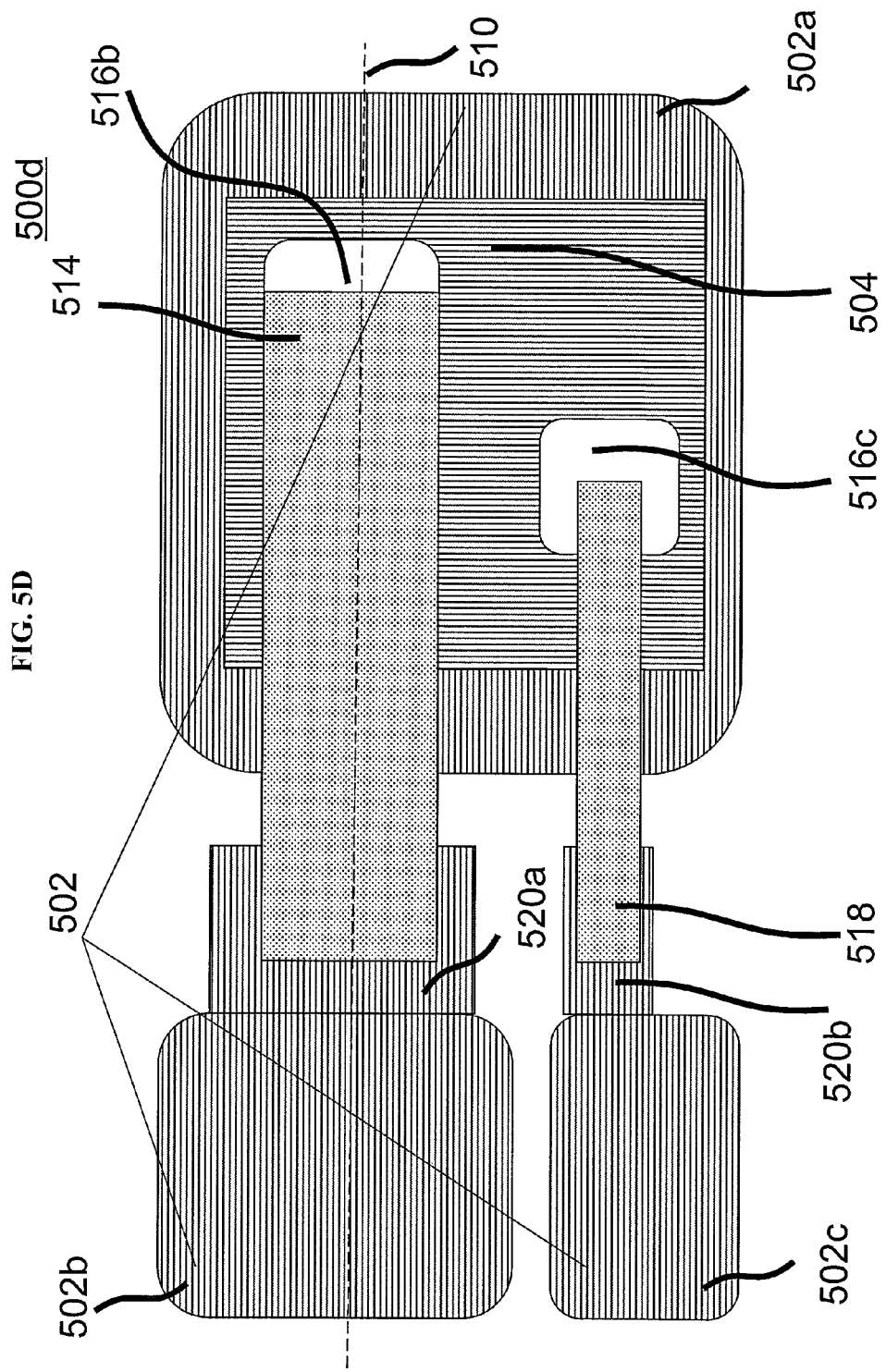

FIG. 5C is a schematic 500c showing a cross-sectional side view of an arrangement including an electrically conductive coupling structure coupled to the chip 504 and the chip carrier 502 as shown in FIG. 5A according to various embodiments. FIG. 5D is a schematic 500d showing a top planar view of the arrangement including an electrically conductive coupling structure coupled to the chip 504 and the chip carrier 502 as shown in FIG. 5B according to various embodiments. FIG. 5C may correspond to the cross sectional view of the arrangement shown in FIG. 5D across the line 510 indicated in FIG. 5D.

The method may include providing an electrically conductive coupling structure 514 to couple the chip 504 with the chip carrier 502. The method may include coupling the electrically conductive coupling structure 514 to the chip carrier 502. The electrically conductive coupling structure 514 may be coupled to the chip carrier 502 by soldering or any other suitable methods. The electrically conductive coupling structure 514 may be coupled to the first lead 502b. The electrically conductive coupling structure 514 may be coupled to the first lead 502b via the first protrusion 520a. The electrically conductive coupling structure may instead be directly coupled to the first lead 502b. The method may also include coupling the electrically conductive coupling structure 514 to the chip 504. The electrically conductive coupling structure 514 may be coupled to the chip 504 by soldering or any other suitable methods. The electrically conductive coupling structure 514 may be coupled to the second chip pad 516b.

The method may include providing a further electrically conductive coupling structure 518 to couple the chip 504 with the chip carrier 502. The method may include coupling the further electrically conductive coupling structure 518 to the chip carrier 502. The further electrically conductive coupling structure 518 may be coupled to the chip carrier 502 by soldering or any other suitable methods. The further electrically conductive coupling structure 518 may be coupled to the second lead 502c. The further electrically conductive coupling structure 518 may be coupled to the second lead 502c via the second protrusion 520b. The electrically conductive coupling structure may instead be directly coupled to the second lead 502c. The method may also include coupling the further electrically conductive coupling structure 518 to the chip 504. The further electrically conductive coupling structure 518 may be coupled to the chip 504 by soldering or any other suitable methods. The further electrically conductive coupling structure 514 may be coupled to the third chip pad 516c.

Figure 5E:
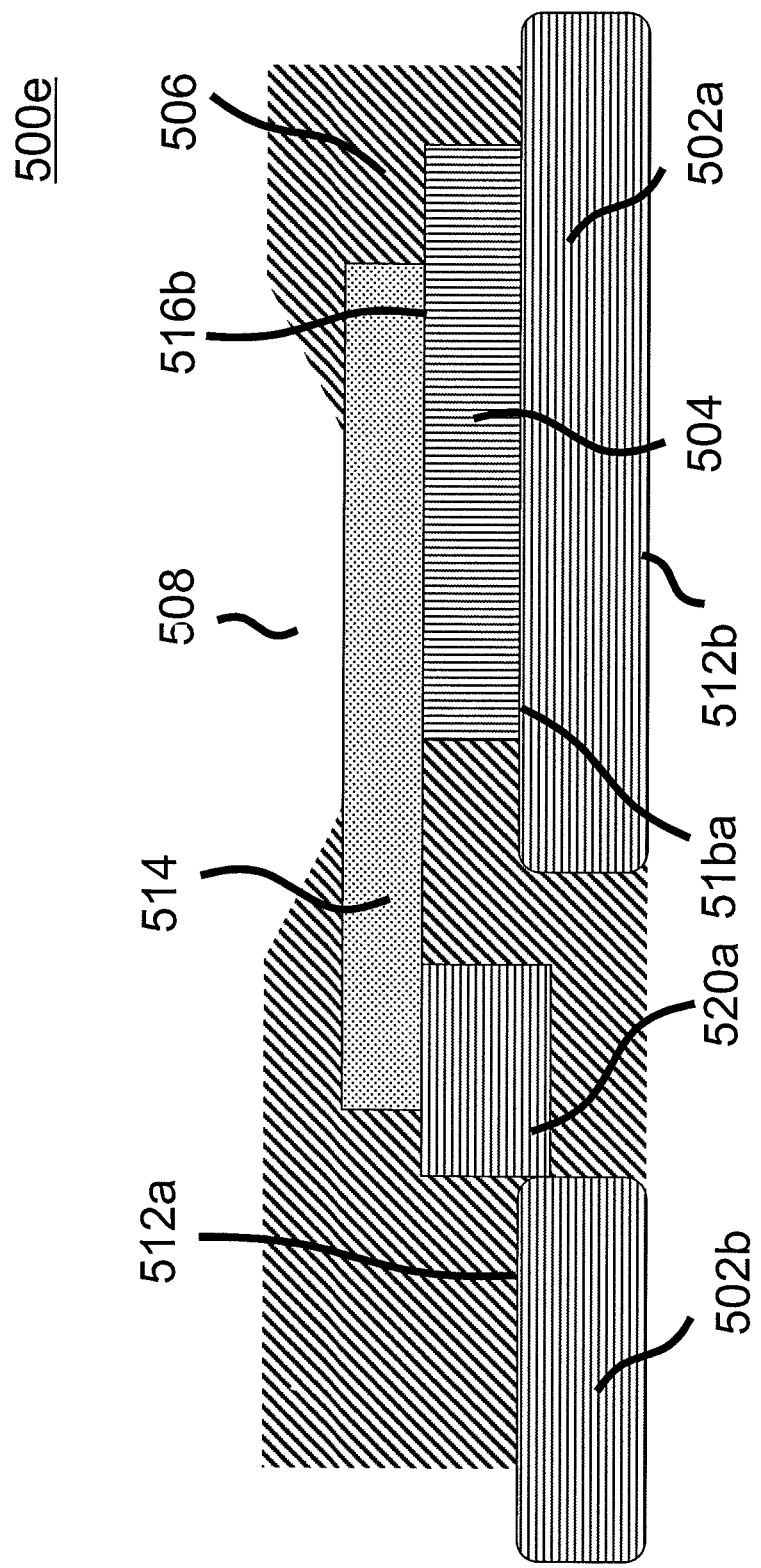
Figure 5F:
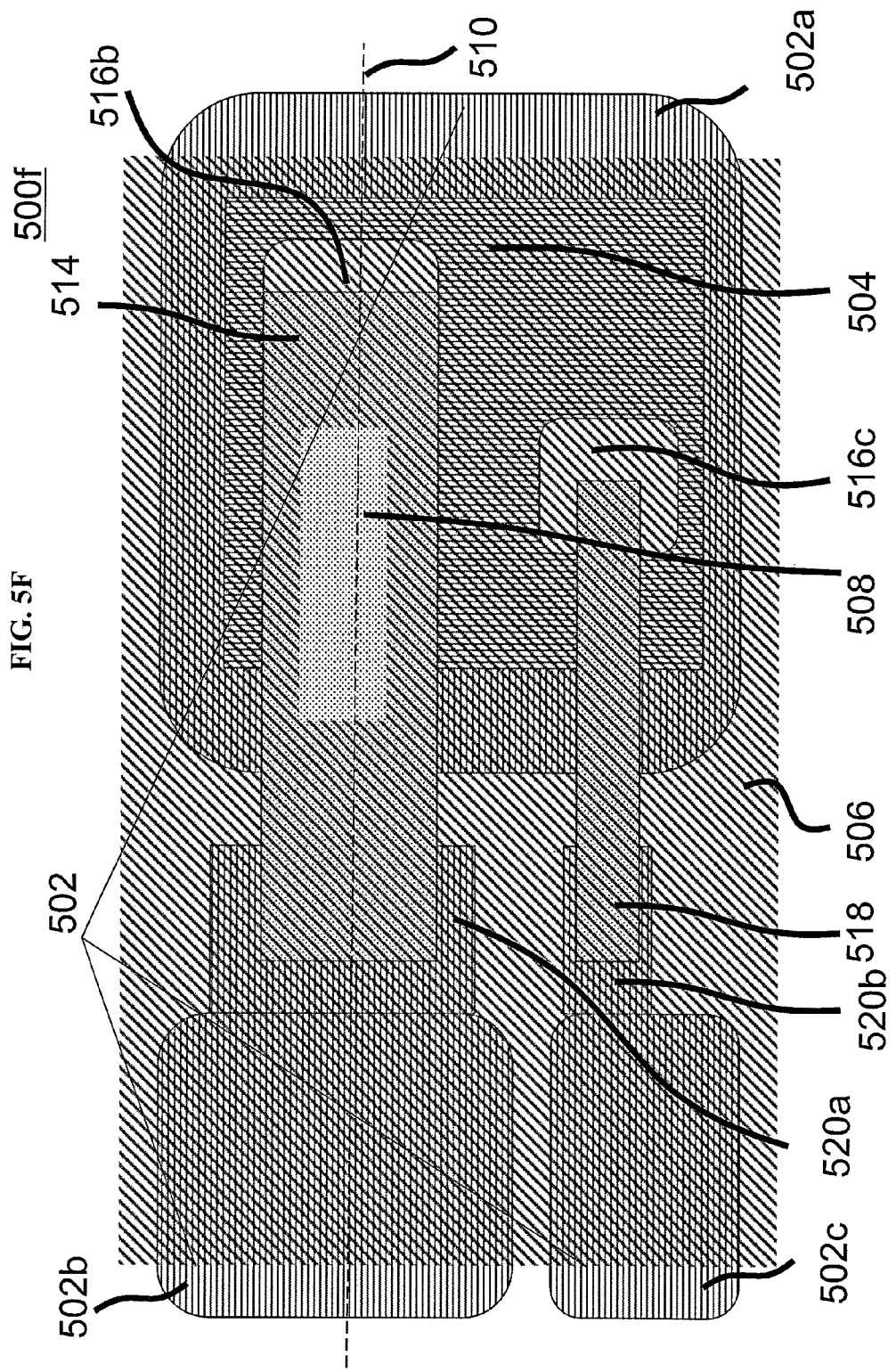

FIG. 5E is a schematic 500e shows a cross-sectional side view of a package after encapsulating the arrangement shown in FIG. 5C according to various embodiments. FIG. 5F is a schematic 500f shows a top planar view of a package after encapsulating the arrangement as shown in FIG. 5D according to various embodiments. FIG. 5E may correspond to the cross sectional view of the package shown in FIG. 5F across the line 510 indicated in FIG. 5F.

The method may further provide encapsulating the chip 504 and the chip carrier 502 with an encapsulating material 506. A coolant receiving recess 508 may be provided in the encapsulation material 506. The method may also provide encapsulating the electrically conductive coupling structure 514 or the further electrically conductive coupling structure 518 or both the electrically conductive coupling structure 514 and the further electrically conductive coupling structure 518. The coolant receiving recess 508 may be formed during encapsulation. In other words, encapsulation and forming the coolant receiving recess 508 may be carried out in one step. Alternatively, the coolant receiving recess 508 may be formed after encapsulating. The coolant recessing recess 508 may also be prefabricated on the encapsulation material 506 before the encapsulation material 506 is used to encapsulate the chip 504 and the chip carrier 502.

Figure 5G:
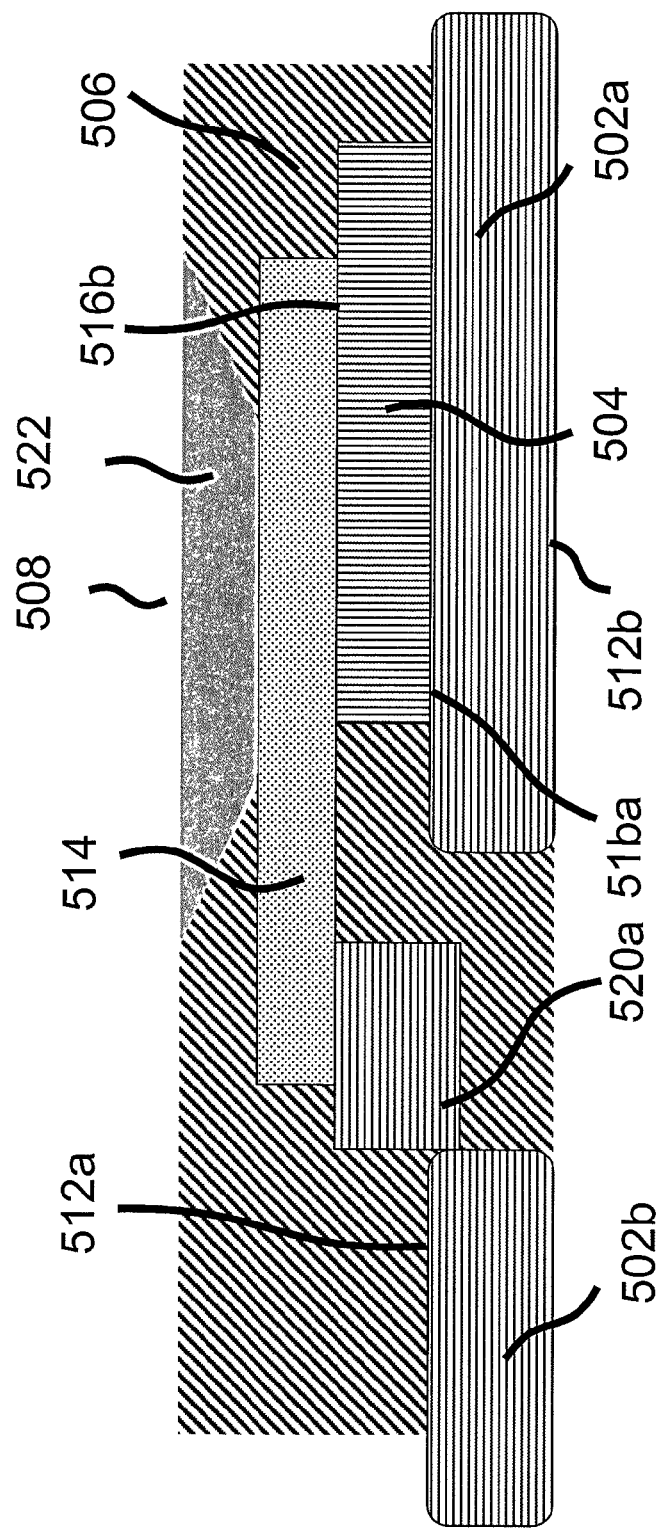
Figure 5H:
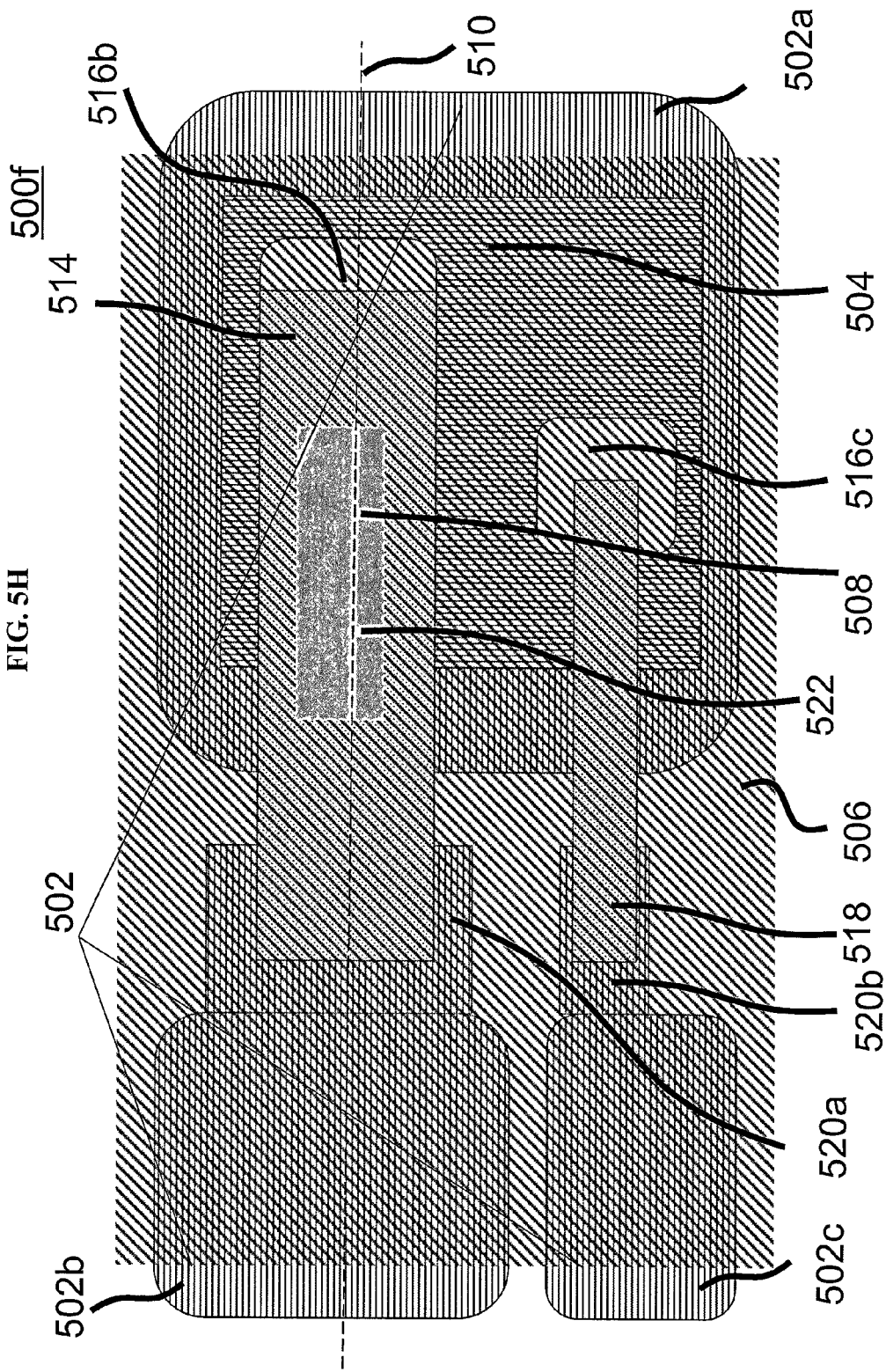

FIG. 5G is a schematic 500g shows a cross-sectional side view of the package shown in FIG. 5E after receiving coolant 522 according to various embodiments. FIG. 5H is a schematic 500h shows a top planar view of the package shown in FIG. 5F after receiving coolant 522 according to various embodiments. FIG. 5G may correspond to the cross sectional view of the package shown in FIG. 5H across the line 510 indicated in FIG. 5H.

In various embodiments, the coolant receiving recess 508 may be configured to receive coolant 522. The method may further provide receiving coolant 522 in the coolant receiving recess 508.

The method may further include forming fluid delivery structures on the encapsulation material 506. The delivery structures may connect the coolant receiving recess 508 to an external input means or to an external output means. The fluid delivery structures may also instead form a enclosed loop.

Receiving coolant 522 in the coolant receiving recess 508 may include a galvanic process. The coolant 522 may include a metal such as copper and nickel. A solution containing the ions of the metal (i.e. metal cations) may be provided in the coolant receiving recess 508. A first half cell including an electrode of the metal may be at least partially submerged in the solution. The electrode of the metal may be deposited on a side or bottom of the coolant receiving recess 508. The first half cell and a second half cell may form a galvanic cell. The second half cell may include an electrode of a subsequent metal. The metal may have a higher electronegativity compared to the subsequent metal. The electrode of the subsequent metal may at least be partially submerged in a solution containing the ions of the subsequent metal (i.e. subsequent metal cations). The ions of the electrode of the metal may be reduced. The ions of the metal (metal ions) of the solution in the coolant receiving recess 508 may be reduced to the metal. On the other hand, the subsequent metal may be oxidized to the subsequent metal cations for the second half cell.

Receiving coolant 522 in the coolant receiving recess 508 may instead include filling the coolant receiving recess at least partially with a solder paste. The coolant 522 may include metals, metal alloys and/or metal compounds. The coolant 522 may include one or more of SnAg, SnCu, InAg, InCu, Zn and PbSn.

Receiving coolant 522 in the coolant receiving recess 508 may include filling the coolant receiving recess at least partially with a thermal paste or a thermal greece. The thermal greece may include a ceramic-based thermal greece, a metal-based thermal greece, a carbon-based thermal greece or a silicon-based thermal greece.

Various embodiments provide a package. The package may include a chip carrier; a chip arranged over the chip carrier; an electrically conductive coupling structure configured to electrically couple the chip to the chip carrier; an encapsulation material encapsulating the chip and partially the electrically coupling structure and the chip carrier; a coolant receiving recess arranged over the electrically coupling structure in the encapsulation material; and coolant received in the coolant receiving recess.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A package, comprising:
 a chip carrier;
 a chip arranged over the chip carrier;
 encapsulation material encapsulating the chip and partially the chip carrier;
 a coolant receiving recess is provided over the chip;
 wherein the coolant receiving recess is configured to receive coolant; wherein the coolant receiving recess exposes at least a portion of the chip pad and/or at least a portion of the chip carrier.

2. The package of claim 1, further comprising:
 coolant received in the coolant receiving recess.

3. The package of claim 2,
 wherein the coolant comprises thermal greece.

4. The package of claim 1,
 wherein the coolant receiving recess has a volume in a range from about 0.25 mm$^3$ to about 250 mm$^3$.

5. The package of claim 1,
 wherein the chip carrier comprises a leadframe comprising a die pad and at least one lead, wherein the coolant receiving recess exposes a portion of the at least one lead.

6. A package, comprising:
 a chip carrier;
 a chip arranged over the chip carrier;
 an electrically conductive coupling structure configured to electrically couple the chip to the chip carrier;
 an encapsulation material encapsulating the chip and partially the electrically coupling structure and the chip carrier;
 a coolant receiving recess arranged over the electrically coupling structure over an exterior surface of the encapsulation material; wherein the coolant receiving recess exposes at least a portion of the chip pad and/or at least a portion of the chip carrier; and
 coolant received in the coolant receiving recess.

7. The package of claim 6,
wherein the coolant comprises thermal greece.

8. The package of claim 6,
wherein the coolant receiving recess has a volume in a range from about 0.25 mm$^3$ to about 250 mm$^3$.

9. The package of claim 6,
wherein the chip carrier comprises a leadframe comprising a die pad and at least one lead, wherein the electrically conductive coupling structure is configured to electrically couple the chip with the at least one lead.

10. The package of claim 6,
wherein the chip carrier comprises a leadframe comprising a die pad and at least one lead, wherein the coolant receiving recess exposes a portion of the at least one lead.

* * * * *